(12) United States Patent
Ghinovker et al.

(10) Patent No.: US 11,774,863 B2
(45) Date of Patent: Oct. 3, 2023

(54) INDUCED DISPLACEMENTS FOR IMPROVED OVERLAY ERROR METROLOGY

(71) Applicant: KLA CORPORATION, Milpitas, CA (US)

(72) Inventors: Mark Ghinovker, Yoqneam Ilit (IL); Yoel Feler, Haifa (IL)

(73) Assignee: KLA CORPORATION, Milpitas, CA (US)

( * ) Notice: Subject to any disclaimer, the term of this patent is extended or adjusted under 35 U.S.C. 154(b) by 173 days.

(21) Appl. No.: 17/612,907

(22) PCT Filed: Oct. 21, 2021

(86) PCT No.: PCT/US2021/055930
§ 371 (c)(1),
(2) Date: Nov. 19, 2021

(87) PCT Pub. No.: WO2023/069095
PCT Pub. Date: Apr. 27, 2023

(65) Prior Publication Data
US 2023/0129618 A1  Apr. 27, 2023

(51) Int. Cl.
*G03F 7/20*  (2006.01)
*G03F 7/00*  (2006.01)

(52) U.S. Cl.
CPC ...... *G03F 7/70633* (2013.01); *G03F 7/70525* (2013.01)

(58) Field of Classification Search
CPC ............ G03F 7/70633; G03F 7/70641; G03F 7/7065; G01B 11/14; G01B 11/26; G01B 11/27; G01B 11/272
See application file for complete search history.

(56) References Cited

U.S. PATENT DOCUMENTS 7,608,468 B1 * 10/2009 Ghinovker ............. G06F 30/39
                                                       702/172
8,339,614 B2 * 12/2012 Kondo .................... G03F 7/706
                                                       430/394
(Continued)

OTHER PUBLICATIONS

WIPO, International Search Report for International Application No. PCT/US2021/055930, dated Jul. 12, 2022.

*Primary Examiner* — Gordon J Stock, Jr.
(74) *Attorney, Agent, or Firm* — HODGSON RUSS LLP

(57) ABSTRACT

A method for semiconductor metrology includes depositing a first film layer on a semiconductor substrate and a second film layer overlying the first film layer. The first and second film layers are patterned to define a plurality of overlay targets comprising first target features formed in the first film layer having respective first locations, which are spaced apart by first nominal distances, and second target features formed in the second film layer having respective second locations, which are spaced apart by second nominal distances, which are different from the first nominal distances. An image of the semiconductor substrate is processed to measure respective displacements between the first and second target locations in each of the overlay targets, and to estimate both an actual overlay error between the patterning of the first and second film layers and a measurement error of the imaging assembly.

20 Claims, 7 Drawing Sheets

(56) References Cited

U.S. PATENT DOCUMENTS

| | | | | |
|---|---|---|---|---|
| 8,706,442 B2* | 4/2014 | Mos | ................ | G03F 9/7003 |
| | | | | 356/389 |
| 9,316,925 B2* | 4/2016 | Cai | ................ | G03F 7/70633 |
| 10,495,983 B2* | 12/2019 | Coskun | ................ | G03F 7/70633 |
| 10,852,646 B2* | 12/2020 | Jochemsen | ................ | G03F 7/70541 |
| 11,248,905 B2* | 2/2022 | Amit | ................ | G03F 7/70683 |
| 11,333,982 B2* | 5/2022 | Marciano | ................ | G03F 7/70633 |
| 11,372,340 B2* | 6/2022 | Kandel | ................ | G03F 7/70633 |
| 11,573,497 B2* | 2/2023 | Negri | ................ | G06T 7/0004 |
| 2006/0109438 A1* | 5/2006 | Smith | ................ | G03F 7/70725 |
| | | | | 355/77 |
| 2015/0204664 A1 | 7/2015 | Bringoltz et al. | | |
| 2016/0370710 A1 | 12/2016 | Wardenier et al. | | |
| 2019/0258178 A1 | 8/2019 | Ten Berge et al. | | |
| 2019/0354024 A1 | 11/2019 | Tsiatmas et al. | | |
| 2021/0302845 A1 | 9/2021 | Verstraeten et al. | | |
| 2021/0358165 A1* | 11/2021 | Simkin | ................ | G06V 10/75 |
| 2022/0328365 A1* | 10/2022 | Manassen | ................ | H01L 22/30 |

* cited by examiner

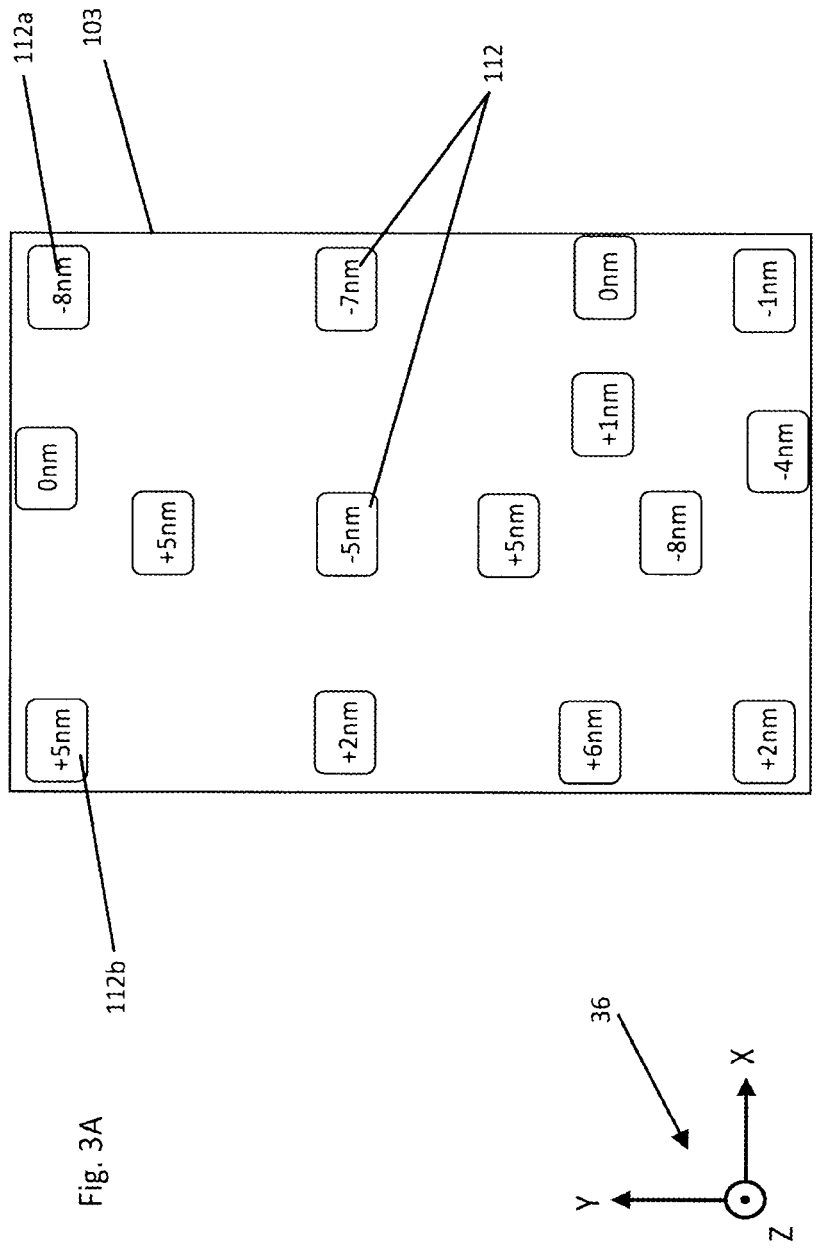

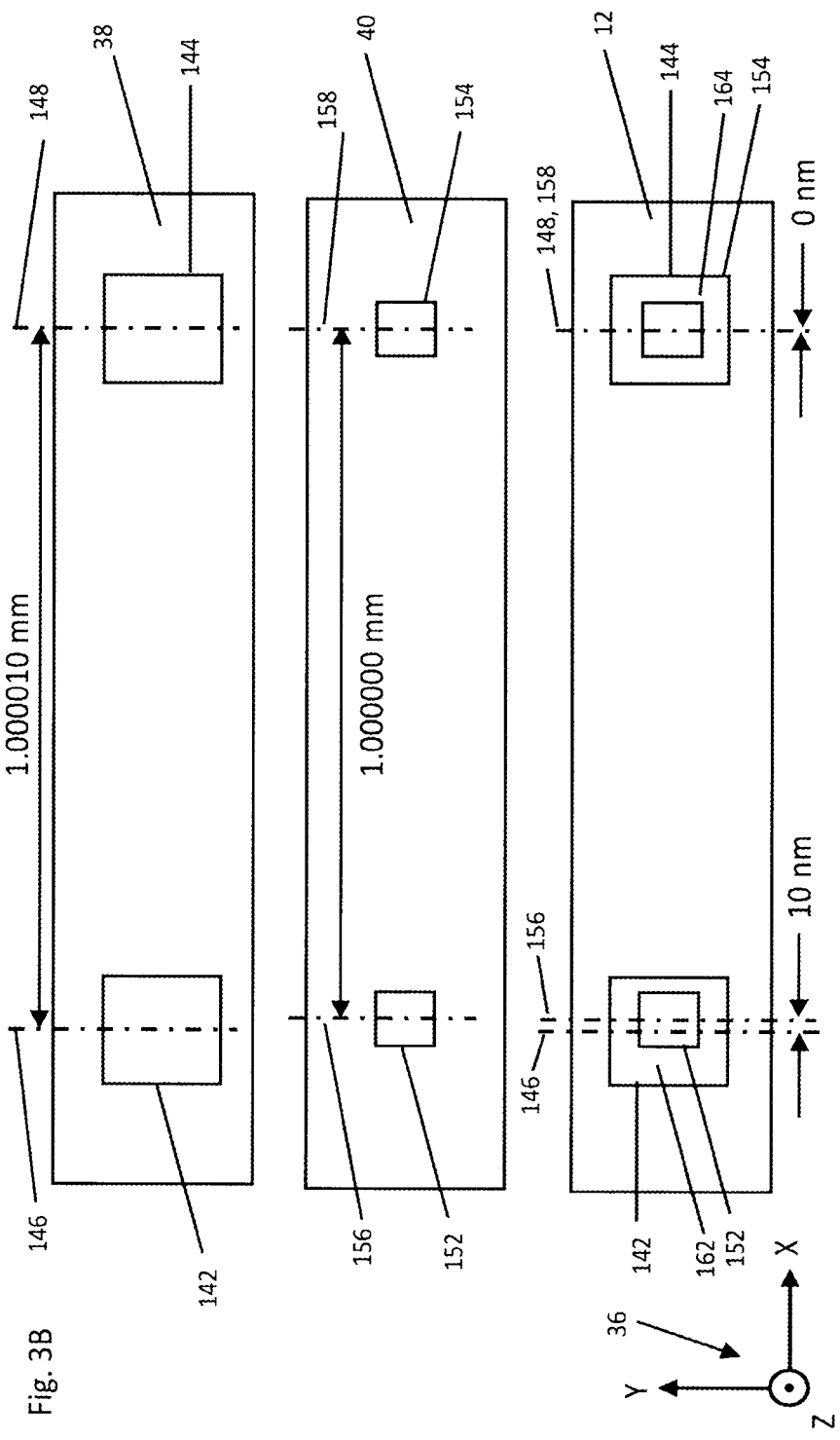

INDUCED DISPLACEMENTS FOR IMPROVED OVERLAY ERROR METROLOGY

FIELD OF THE INVENTION

The present invention relates generally to manufacture of semiconductor devices, and particularly to methods and target features for semiconductor circuit metrology.

BACKGROUND

Semiconductor circuits are commonly manufactured using photolithographic methods. In photolithography, a thin layer of a photosensitive polymer (photoresist) is deposited over a semiconductor substrate and patterned using optical or other radiation, leaving parts of the substrate covered by the photoresist. The photoresist is patterned by a scanner projecting an image of a reticle onto the photoresist, typically using ultraviolet radiation. After patterning, the substrate is modified by methods such as etching and ion bombardment to change the material properties and/or the topography of the substrate, while the parts of the substrate covered by the photoresist are not affected.

Semiconductor circuit metrology is used for measuring properties of the patterned photoresist, such as the topography and location of the patterned features. Accurate location of the patterned features of the photoresist with respect to previous process layers is crucial for achieving a high yield of the photolithographic process. Any error in the registration (misregistration) of the patterned photoresist with respect to an underlying process layer is referred to as "overlay error." As an example, in typical semiconductor circuits with minimum line-widths of 10-14 nm (so-called 10-nm design rule), the maximal permissible overlay error is 2-3 nm. In leading-edge semiconductor circuits, the line-widths are shrinking to 5 nm, with a concomitant reduction in maximal permissible overlay error.

Overlay error is commonly measured using optical overlay metrology apparatuses (commonly called optical overlay metrology tools) as optical radiation in the visible and infrared wavelengths is capable of penetrating through the photoresist layer, as well as through dielectric layers under the photoresist. Furthermore, infrared wavelengths are capable of penetrating a semiconductor substrate, such as silicon, enabling metrology through the substrate.

Optical overlay metrology tools, such as the Archer™-series tools by KLA Corporation (Milpitas, Calif., USA), image an overlay target (such as AIM™ overlay target by KLA) located in the scribe lines of the semiconductor substrate (the lines separating adjacent dies) and/or within the dies. An image analysis algorithm is applied to the acquired images in order to locate the center of symmetry of the target features in the process layer and the center of symmetry of the target features in the patterned photoresist layer. The overlay error is computed based on the displacement between the centers of symmetry of the target features in the two layers.

Alternatively, the overlay error may be measured in a scatterometry mode. In this measurement mode, a scatterometric image of periodic target features of the overlay target is captured from the exit pupil of the objective lens of the metrology tool. The scatterometric image, indicative of the angular distribution of the optical radiation that is scattered from the target features, is processed in order to measure the overlay error.

The terms "optical rays," "optical radiation," "light," and "beams of radiation," as used in the present description and in the claims, refer generally to any and all of visible, infrared, and ultraviolet radiation.

SUMMARY

Embodiments of the present invention that are described hereinbelow provide improved methods and target features for semiconductor circuit metrology.

There is therefore provided, in accordance with an embodiment of the invention, a method for semiconductor metrology. The method includes depositing a first film layer on a semiconductor substrate and a second film layer overlying the first film layer. The first and second film layers are patterned to define a plurality of overlay targets including first target features formed in the first film layer having respective first locations, which are spaced apart by first nominal distances, and second target features formed in the second film layer having respective second locations, which are spaced apart by second nominal distances, which are different from the first nominal distances. Each second target feature overlies a respective first target feature to define a respective one of the overlay targets. The method further includes capturing at least one image, using an imaging assembly, of the semiconductor substrate on which the overlay targets have been formed, and processing the at least one image to measure respective displacements between the first and second target locations in each of the overlay targets. Based on the measured displacements and the first and second nominal distances, both an actual overlay error between the patterning of the first and second film layers and a measurement error of the imaging assembly are estimated.

In some embodiments, patterning the first and second film layers includes patterning a matrix of fields and defining multiple overlay targets in each of the fields, and capturing an image includes capturing at least one image of the multiple overlay targets in at least one of the fields.

In further embodiments, the first nominal distances and the second nominal distances are selected so that for each overlay target the respective displacement between the first and second locations corresponds to a respective nominal displacement. Additionally or alternatively, estimating both the actual overlay error and the measurement error includes comparing the measured displacements to respective modeled displacements for a set of the overlay targets, each modeled displacement including a sum of a displacement computed from a scanner model and the respective nominal displacement for a given overlay target.

In yet further embodiments, the scanner model includes coefficients defining displacements between patterns formed in the first and second film layers by a photolithographic process.

In some embodiments, estimating the measurement error includes finding a coefficient of linearity between respective nominal displacements and measured displacements over the set of the overlay targets. Additionally or alternatively, finding the coefficient of linearity includes applying a method of regression between the respective measured and modeled displacements in order to estimate the coefficients of the scanner model and the coefficient of linearity.

In further embodiments, estimating the actual overlay error includes applying the coefficient of linearity to the measured displacements.

In yet further embodiments, estimating the actual overlay error and the measurement error includes finding coefficients of a scanner model, and patterning the first and second film layers includes selecting respective nominal displacements of the overlay targets that are at least partially orthogonal to the scanner model. Additionally or alternatively, selecting the respective nominal displacements includes computing a projection of the nominal displacements onto the scanner model, and choosing the respective nominal displacements so that the projection does not exceed a predefined limit.

In some embodiments, selecting the respective nominal displacements includes computing at a location of each overlay target an orthogonal nominal displacement for use in choosing the respective nominal displacements of the overlay targets.

There is also provided, in accordance with an embodiment of the invention, an optical metrology apparatus. The apparatus includes a semiconductor substrate having deposited thereon a first film layer and a second film layer overlying the first film layer. The first and second film layers are patterned to define a plurality of overlay targets including first target features formed in the first film layer having respective first locations, which are spaced apart by first nominal distances, and second target features formed in the second film layer having respective second locations, which are spaced apart by second nominal distances, which are different from the first nominal distances. Each second target feature overlies a respective first target feature to define a respective one of the overlay targets. The apparatus further includes an imaging assembly configured to capture at least one image of the semiconductor substrate on which the overlay targets have been formed. A controller is configured to process the at least one image to measure respective displacements between the first and second target locations in each of the overlay targets and based on the measured displacements and the first and second nominal distances, to estimate both an actual overlay error between the patterning of the first and second film layers and a measurement error of the imaging assembly.

The present invention will be more fully understood from the following detailed description of the embodiments thereof, taken together with the drawings in which:

BRIEF DESCRIPTION OF THE DRAWINGS

FIG. 3A is a schematic top view of a single field of the semiconductor substrate of FIG. 1 showing overlay targets, in accordance with an embodiment of the invention;

FIG. 3B is a schematic top view of two overly targets, in accordance with an embodiment of the invention;

DETAILED DESCRIPTION OF EMBODIMENTS

Overview

Figure 1:
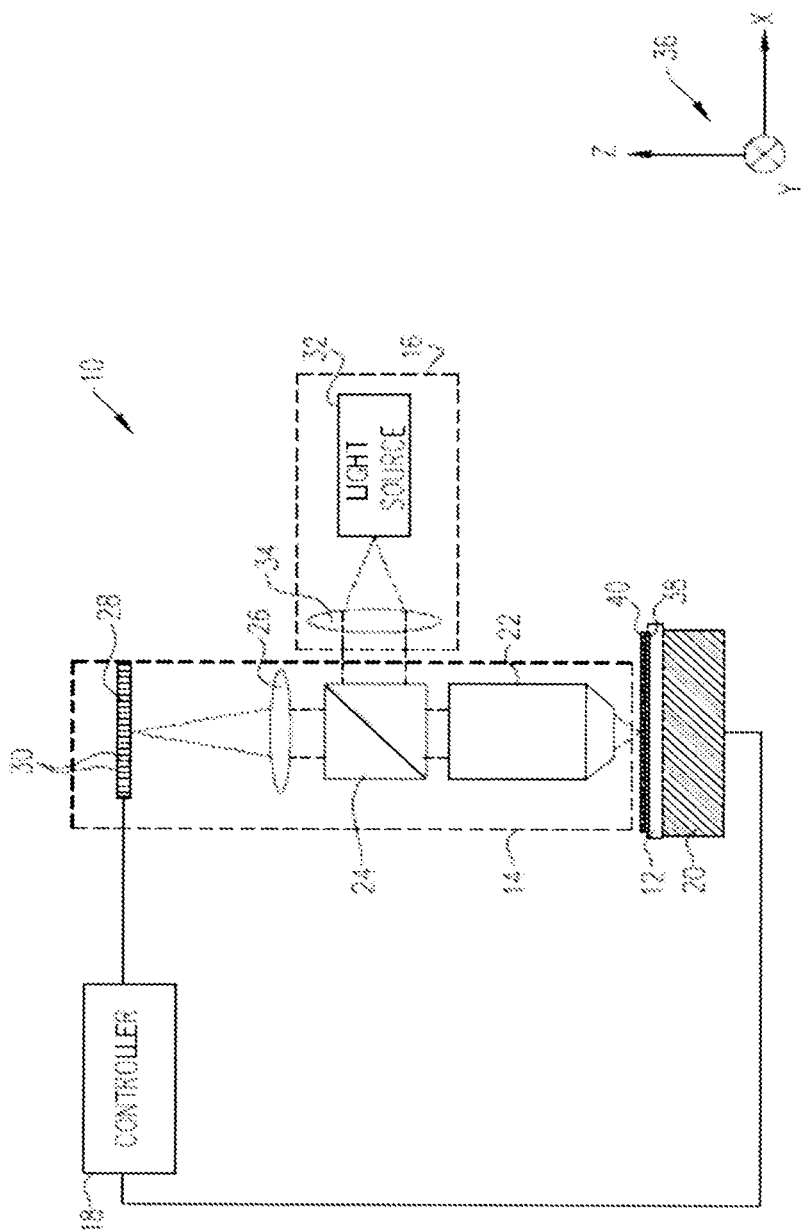
FIG. 1 is a schematic side view of an optical metrology apparatus for measuring overlay error on a semiconductor substrate, in accordance with an embodiment of the invention.

Overlay targets for overlay metrology are commonly used for precise and accurate measurements of the overlay error between successive patterned layers on a semiconductor substrate. These layers may comprise, for example, a process layer and a resist layer (photoresist), or, in after-etch applications, two process layers, or, as in some multiple patterning applications, one process layer. Thus, although some example embodiments are described below with reference to a process layer and a resist layer, the principles of these embodiments may be applied, mutatis mutandis, to a first process layer and a second process layer. In some multiple patterning applications, the first and second process layers may comprise the same material.

In the fabrication process of semiconductor circuits, the measured overlay errors are commonly used for computing and providing feedback to the scanner that is used in printing the features of the circuits in the photolithographic process. As will be further detailed hereinbelow, the feedback is given in the form of coefficients of a given scanner model (referred to as "correctibles"). This model describes errors in the positioning and orientation of the semiconductor substrate in the scanner (wafer model), as well as optical and mechanical pattern placement errors between the reticle of the scanner and the substrate (field model). Alternatively or additionally, the measured overlay errors may be used for "dispositioning" the semiconductor substrate, i.e., determining whether the displacements of a photoresist pattern across the semiconductor substrate with respect to the previous process layer are within predefined limits, so that processing of the substrate can continue to the next step, or whether the patterned substrate has to be returned for repeat processing.

The accuracy of the correctibles, however, can be affected by inaccuracies of the metrology apparatus that is used in measuring the overlay error, for example measurement errors in the imaging assembly of the metrology apparatus. For example, the measured displacements between the centers of symmetry of the target features in the process layers, as measured by the metrology apparatus and denoted by Meas_Displ, may have a linear relationship to the actual displacements, denoted by Actual_Displ, but may have a coefficient of linearity that deviates from an ideal value of one. The linear relationship may be written as an equation Meas_Displ=$\alpha$*Actual_Displ+$\beta$. In this equation, $\alpha$ is the coefficient of linearity and $\beta$ is the offset, which is generally negligible in practical applications. Having a coefficient of linearity $\alpha$ that differs from one may significantly distort the measured values of overlay error. These distortions, in turn, may send erroneous feedback to the scanner in the form of inaccurate correctibles and may even lead to an incorrect decision about the dispositioning of a patterned semiconductor substrate. Although in the embodiments described below, a linear error model is used to estimate the error introduced by the metrology apparatus, a higher-order error model, such as a quadratic or other functional model, may alternatively be used.

The embodiments of the present invention that are described herein address the above-described problems of overlay error metrology by estimating both the actual overlay error between the patterning of the first and second film layers and the measurement error of the imaging assembly. For this purpose, for example, the disclosed embodiments provide a method for extracting the coefficient of linearity between the measured and actual overlay errors.

In the description hereinbelow, each overlay target in a pair of successive film layers on a semiconductor substrate is made up of one or more first target features formed in the first film layer with a first location and second target features formed in the second film layer with a second location. (The term "successive" refers to the order of deposition of the first and second film layers on the substrate but does not imply immediate succession, i.e., there may be one or more additional layers between the first and second layers referred to here.) In metrology systems that are known in the art, the nominal displacement between the first and second locations, also referred to as the "offset," is zero. For such zero-displacement or zero-offset targets, the overlay error, as measured by an ideal metrology system, is zero. This nominal displacement is implemented in the design of the reticles used in the photolithographic process. In practice, however, the actual displacement between the locations is non-zero, due to misalignment and other fabrication errors.

In embodiments of the present invention, however, the nominal displacements between the respective locations of the target features in at least some of the overlay targets are intentionally set to known non-zero values. Thus even under ideal measurement conditions, the actual displacements will vary from target to target, and the actual displacement between the first and second sets of target features is given by the overlay error caused by the process with the addition of the intentional (nominal) displacement between the locations. Thus, the measured displacement, i.e., the displacement between the first and second sets of target features of an overlay target as measured by the metrology apparatus, is equal to the sum of the actual displacement between these features and any error introduced by the metrology apparatus. The intentional, varying displacement between the locations of the target features is used in the present embodiments to estimate the measurement error and thus derive a more accurate measurement of the actual overlay error.

To create a set of overlay targets that can be used in this manner, first and second film layers are deposited on a semiconductor surface, with the second film layer overlying the first film layer. In some multiple-patterning applications, such as "litho-freeze litho-etch" (LFLE), the first and second layers comprise the same film material. The first and second film layers are patterned to define a plurality of overlay targets comprising first and second target features in the first and second film layers, respectively, with respective first and second locations. The first target features are spaced apart by first nominal distances, while the second locations are spaced apart by second nominal distances, which are different from the first nominal distances. Each second target feature overlies a respective first target feature to define one of the overlay targets, but because of the different nominal distances between the locations, the overlay targets have different nominal displacements. (The term "overlie" is used in the context of the present description and in the claims in accordance with its plain meaning: that one of the target features is disposed over the other, but without limitation as to the precise alignment or overlap of the features.)

An imaging assembly in a metrology tool captures one or more images of the semiconductor substrate on which the overlay targets have been formed. The image or images are processed to measure respective displacements between the first and second target locations in each of the overlay targets. As noted earlier, these displacements reflect both the actual displacement between patterns in the film layers due to process errors and the measurement errors of the imaging assembly. Based on these measured displacements and on the known variation of the nominal displacements (as a result of the different nominal distances in the first and second layers), both the measurement error of the imaging assembly and the actual overlay error between the patterning of the first and second film layers can be estimated. By modeling the measurement error, for example by finding the coefficient of linearity, the actual overlay error can be derived with improved accuracy.

In the embodiments that are described below, the locations of the target features are determined by predefined geometrical characteristics of these features, for example their respective centers of symmetry. Alternatively, other characteristics of the target features may be used in determining their locations.

Although the described embodiments refer to imaging overlay error metrology, the principles of the present invention may similarly be applied to additional overlay error metrology methods. Further, although the described embodiments refer to patterning by a scanner, the principles of the present invention may similarly be applied to patterns generated by alternative or more complex methods of patterning.

System Description

FIG. 1 is a schematic side view of an optical metrology apparatus 10 for measuring a displacement between two patterned film layers on a semiconductor substrate 12, in accordance with an embodiment of the invention. This apparatus is shown by way of example, for the sake of concreteness and clarity; and the principles of the present invention may similarly be applied using metrology tools of other sorts, as are known in the art.

Optical metrology apparatus 10 comprises an imaging assembly 14, an illumination assembly 16, a controller 18, and a table 20 on which substrate 12 is mounted. Imaging assembly 14 comprises an objective lens 22, a cube beamsplitter 24, and an imaging lens 26. Imaging assembly 14 further comprises a sensor 28, comprising for example, a complementary metal-oxide-semiconductor (CMOS) image sensor with a two-dimensional array of pixels 30.

Illumination assembly 16 comprises a light source 32, emitting optical radiation, and a lens 34. Table 20 is located in proximity to objective lens 22, and comprises actuators, controlled by controller 18, which can move the table linearly in x-, y-, and z-directions (with reference to Cartesian coordinates 36), as well as rotate the table around the z-axis. Cartesian coordinates 36 are shown in this and subsequent figures in order to clarify the orientation of these figures with respect to apparatus 10.

In the pictured embodiment, first and second film layers 38 and 40 have been deposited on semiconductor substrate 12 and patterned in a lithographic process, as shown in the figures that follow. In the present example, first layer 38 is a process layer, and second layer 40 is a resist layer, which is deposited over the process layer. Alternatively both of layers 38 and 40 may be process layers, including layers comprising the same material.

Figure 2:
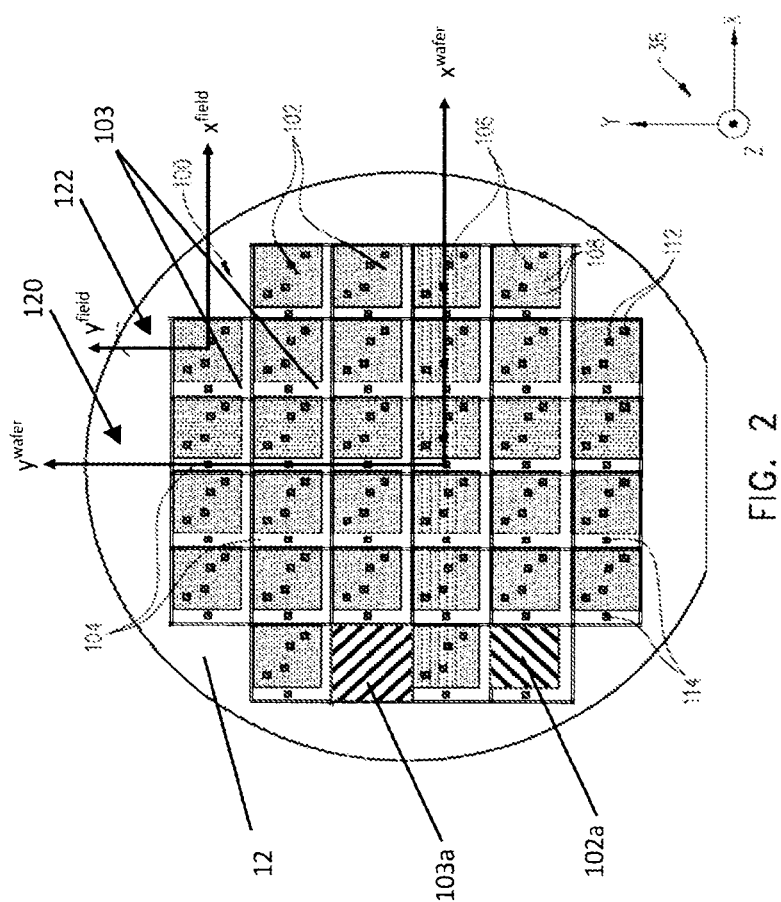
FIG. 2 is a schematic top view of the semiconductor substrate of FIG. 1, showing overlay targets on the substrate in accordance with an embodiment of the invention.

To measure the displacement between the pattern in layer 40 and the pattern in underlying layer 38 on substrate 12, overlay targets comprising target features, as shown in FIGS. 2 and 3A-3B hereinbelow, have been formed by processes of photolithography in layers 38 and 40. Substrate 12 is positioned on table 20 so that the combined optics of lens 22 and lens 26 image the substrate onto sensor 28, i.e., the substrate and the sensor are located at optical conjugate planes.

Controller 18 receives images from sensor 28 and adjusts the location and orientation of table 20. Controller 18 typically comprises a programmable processor, which is programmed in software and/or firmware to carry out the functions that are described herein, along with suitable digital and/or analog interfaces for connection to the other elements of apparatus 10. Alternatively or additionally, controller 18 comprises hard-wired and/or programmable hardware logic circuits, which carry out at least some of the functions of the controller. Although controller 18 is shown in FIG. 1, for the sake of simplicity, as a single, monolithic functional block, in practice the controller may comprise multiple, interconnected control units, with suitable interfaces for receiving and outputting the signals that are illustrated in the figures and are described in the text. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like.

To capture an image of overlay targets on semiconductor substrate 12, light source 32 projects a beam of optical radiation to lens 34, which further projects the beam to cube beamsplitter 24. Beamsplitter 24 reflects the beam into objective lens 22, which projects the beam onto substrate 12. The radiation impinging on substrate 12 is scattered back to objective lens 22 and passed on to beamsplitter 24, transmitted to lens 26, and focused onto sensor 28. Controller 18 reads out the images captured by sensor 28 and processes the images in order to identify respective locations of the features of overlay targets in layer 40 and in underlying layer 38 on substrate 12. Controller 18 measures the displacement between these two patterned layers based on the displacement between the respective locations of the target features.

Alternatively, apparatus 10 may be configured for measuring the displacement in a scatterometry mode. For this mode, lens 26 is modified and/or moved so as to image the exit pupil (not shown) of objective lens 22 onto sensor array 28. This scatterometric image is indicative of the angular distribution of the optical radiation that is scattered from the target features, and controller 18 in this case is configured to process the angular distribution in order to measure the displacement.

FIG. 2 is a schematic top view (from the z-direction) of semiconductor substrate 12, showing overlay targets 112, 114 on the substrate in accordance with an embodiment of the invention.

In a photolithographic process, a matrix 100 of M fields 103 have been exposed on substrate 12. (In the displayed embodiment, the number of fields M is 32, although in alternative embodiments the number of fields may be less or more than 32.) In successive exposure steps of the photolithographic process, a scanner projects an image of a reticle onto a field 103 for exposing a die 102 together with multiple overlay targets 112 and 114, further detailed hereinbelow. (In alternative embodiments, more than one die 102 may be exposed within one field 103.) In order to clarify the difference between field 103 and die 102 in FIG. 2, a field 103a has been marked with cross-hatching, and a die 102a (not in field 103a) has been marked with opposite cross-hatching. Dies 102 are separated by scribe lines 104 and contain active areas 106 (circumscribed by the scribe lines) comprising electrical circuit components 108.

In an example embodiment, semiconductor substrate 12, commonly also called a wafer or semiconductor wafer, typically has a diameter of 300 mm. Each die 102 is typically a square with dimensions 20 mm×20 mm, for example, although other sizes and shapes are alternatively used. Scribe lines 104 typically have widths of about 100 μm.

The film layers on semiconductor substrate 12 (such as layers 38 and 40, shown in FIG. 1) are patterned to define N offset overlay targets 112 (N≥2) within each field 103, with non-zero nominal displacements between centers of symmetry of the target features in layers 38 and 40, as detailed further hereinbelow. Alternatively, the nominal displacements, as well as the measured displacements, may be defined between other geometrical characteristics of the target features. The film layers may also be patterned to define additional default overlay targets 114 within each field 103, with a zero nominal displacement. Although offset targets 112 are shown in FIG. 2 within dies 102, and default overlay targets 114 are shown in scribe lines 104, each type of overlay target may alternatively be located in any place in field 103.

In order to define the scanner correctibles, as detailed hereinbelow, each point within each field 103 is defined using two two-dimensional Cartesian coordinate systems wafer coordinate axes 120 and field coordinate axes 122, with their respective x- and y-axes aligned with the x- and y-axes of Cartesian coordinates 36. Wafer coordinate axes 120 are referenced to the wafer (i.e., to the semiconductor substrate 12), with its coordinate axes labelled as $x^W$ and $y^W$, with W referring to "wafer." Each field 103 has its respective field coordinate axes 122, positioned identically in each respective field, with the coordinate axes labelled as $x^F$ and $y^F$, with F referring to "field." (For the sake of clarity, only one set of field coordinate axes 122 is shown.) Thus, the location of a given point in field 103 may be described by four coordinates $(x^W, y^W, x^F, y^F)$, wherein $x^W$ and $y^W$ refer to wafer coordinate axes 120 and $x^F$ and $y^F$ refer to field coordinate axes 122 (of the specific field where the point is located.)

Labelling fields 103 by j, wherein j=1, 2, . . . , M, and labelling offset targets 112 by i, wherein i=1, 2, . . . , N, the coordinates of the nominal displacement targets within semiconductor substrate 12 may be written as $x^W_{i,j}, y^W_{i,j}, x^F_i, y^F_i$) The field coordinates $(x^F_i, y^F_i)$ associated with field coordinate axes 122 have only one index (i), as the field coordinate axes repeat in each field 103.

FIG. 3A is a schematic top view of a single field 103 of semiconductor substrate 12 showing offset overlay targets 112, in accordance with an embodiment of the invention.

Each offset overlay target 112 comprises a first set of target features formed in first film layer 38 and a second set of target features formed in second film layer 40. These two sets of target features are formed by the scanner having exposed (at respective photolithographic process steps) a respective photoresist layer through a first reticle for forming the first set of target features in layer 38 and similarly having exposed layer 40 through a second reticle for forming the second set of target features. The first reticle has been designed and fabricated so as to form the first target features spaced apart by first nominal distances using highly accurate fabrication methods, such as electron-beam writing. Similarly, the second reticle has been designed and fabricated, so as to form the second target features spaced apart by second nominal distances, wherein the second nominal distances are different from the first predefined nominal distances. Each second target feature overlies a respective first target feature and defines a corresponding offset target 112.

The first and second nominal distances have been selected so that each offset overlay target 112, comprising first and second target features, has a nominal displacement of ΔX and ΔY in the respective x- and y-directions between the centers of symmetry of the first and second sets of target features. In the pictured embodiment, the nominal displacements ΔX and ΔY are equal and are indicated by a numerical label within each target 112 in FIG. 3A. (Alternatively, unequal nominal displacements ΔX and ΔY may be selected, in which case each target 112 would be characterized by two displacement figures.) Thus, for an offset overlay target 112a, the second set of target features has been nominally displaced, relative to the first set of target features, by ΔX=+8 nm and ΔY=+8 nm, i.e., 8 nm in both positive axis directions, whereas for an offset target 112b, the nominal displacements are ΔX=−5 nm and ΔY=−5 nm, i.e., 5 nm in the negative axis directions.

Although in the present embodiment, offset overlay targets 112 have nominal displacements in both x- and y-directions, the same principles can be applied, mutatis mutandis, to one-directional overlay targets, having offsets in only one direction.

In general, N offset overlay targets i are formed in field 103, with respective nominal displacements $\Delta X_i$ and $\Delta Y_i$, wherein i=1, 2, . . . , N. In the description below, N is taken to be 15, although other numbers of targets, both smaller and larger than 15, may be formed. It is advantageous that the nominal displacements of targets 112 be of the same order of magnitude as the expected overlay errors in the photolithographic process under test.

The N offset overlay targets may be either similar or dissimilar. An example of similar targets are box-in-box targets, wherein the outer box of the target is formed in the process layer and the inner box is formed in the resist layer. An example of dissimilar targets are box-in-box targets, wherein for some of the targets the outer box is in the process layer and the inner box in the resist layer, whereas for the other targets the inner box is in the process layer and the outer box is in the resist layer. This kind of scheme may be applied to other target designs, too, for example AIM-targets.

FIG. 3B is a schematic top view of the components of two overlay targets 162 and 164, in accordance with an embodiment of the invention. These targets are made up of first target features 142 and 144 in layer 38 and second target features 152 and 154 in layer 40, forming two box-in-box overlay targets 162 and 164 on semiconductor substrate 12. The target features of box-in-box overlay targets, as used in overlay error metrology and as used in the present embodiment to exemplify displacements of overlay targets, comprise two nominally concentric squares (one inside the other) aligned along the x- and y-axes. The outer square typically has dimensions of 20 μm×20 μm and the inner square has dimensions of 10 μm×10 μm, although other dimensions may alternatively be used. The center of each square in both the x- and y-directions is the center of symmetry of the square, used here to define the location of the target feature. For the sake of clarity, the pictured embodiment shows displacements of the target features (squares) only in the x-direction, with the centers of the target features aligned to each other in the y-direction.

Two first target features 142 and 144, comprising two squares, are formed in first film layer 38. Center lines 146 and 148 mark the centers of first target features 142 and 144 in the x-direction, respectively. First target features 142 and 144 are spaced apart in the x-direction by a first nominal distance of 1.000010 mm, shown as the distance between center lines 146 and 148. Two second target features 152 and 154 (two squares) are formed in second film layer 40. Center lines 156 and 158 mark the centers of second target features 152 and 154 in the x-direction, respectively. Second target features 152 and 154 are spaced apart in the x-direction by a second nominal distance of 1.000000 mm, shown as the distance between center lines 156 and 158. (For the sake of clarity, the difference of the two nominal distances is shown highly exaggerated.)

Assuming that there are no errors in the photolithographic process in which target features 142, 144, 152, and 154 are formed in the respective film layers on semiconductor substrate 12, the target features are aligned in the x-direction so that center lines 148 and 158 of respective target features 144 and 154 are aligned on top of each other, forming overlay target 164. Thus, the nominal displacement of overlay target 164 is zero (similar to, for example, targets 114 in FIG. 2), as shown by having center lines 148 and 158 of the two target features on top of each other on semiconductor substrate 12. Due to this zero alignment of target features 144 and 154 and due to the difference between the first and second nominal distances of 1.000010 mm and 1.000000 mm between the two pairs of center lines 146 and 148 and 156 and 158, respectively, overlay target 162, formed by target features 142 and 152, has a 10 nm (0.000010 mm) nominal displacement in the x-direction, as shown by the separation of the respective center lines 146 and 156 on semiconductor substrate 12. Thus overlay target 162 is similar to offset overlay targets 112.

Although the target features are aligned in the pictured embodiment so as to have zero nominal displacement for overlay target 164, a different alignment scheme may be implemented, changing the nominal displacements of overlay targets 162 and 164 accordingly. When overlay errors occur, the actual displacements will differ from the nominal displacements.

Nominal displacements in the y-direction (or nominal displacements in both x- and y-directions) may be implemented in a similar way in box-and-box overlay targets, as well as in other kinds of overlay targets, such as AIM, AIMid (in-die AIM), rAIM (robust-AIM Moiré), and SCOL (scatterometry overlay) targets offered by KLA.

Metrology and Analysis

1. Scanner Model

Scanner models are used to describe overlay errors induced by misplacement of semiconductor substrate 12 in a scanner, as well as errors produced within the scanner in projecting the image of a reticle onto the substrate and other errors with a similar systematic behavior. For example, the scanner model may describe the scanner-induced overlay errors on a wafer, i.e., on semiconductor substrate 12, at a point $(x^W, y^W, x^F, y^F)$ by Model_OVLX $(x^W, y^W, x^F, y^F)$ and Model_OVLY $(x^W, y^W, x^F, y^F)$ in the respective x- and y-directions by the following two equations:

$$\text{Model\_OVLX}(x^W, y^W, x^F, y^F) = \text{OffX} + \text{ScalX}*x^W + \text{WRotX}*y^W + \text{MagX}*x^F + \text{FRotX}*y^F$$

and $$\text{Model\_OVLY}(x^W, y^W, x^F, y^F) = \text{OffY} + \text{WrotY}*x^W + \text{ScalY}*y^W + \text{FRotY}*x^F + \text{MagY}*y^F,$$

wherein OVL refers to overlay error. The scanner correctibles, multiplied by the appropriate coordinates, give pattern placement errors due to various errors within the scanner as follows:

OffX=Pattern placement error due to a fixed misplacement of the wafer (semiconductor substrate 12) in the x-direction;

OffY=Pattern placement error due to a fixed misplacement of the wafer in the y-direction;

ScalX=Pattern placement error in the x-direction due to a scaling error of the wafer movement, i.e., error due to the wafer moving within the scanner by a distance that differs from the intended distance by a constant factor;

ScalY=Pattern placement error in the y-direction due to a scaling error of the wafer movement;

WRotX=Pattern placement error in the x-direction due to a wafer rotation, i.e., due to an angular error in the placement of the wafer within the scanner;

WRotY=Pattern placement error in the y-direction due to a wafer rotation;

MagX=Pattern placement error in the x-direction due to optical magnification error of the scanner;

MagY=Pattern placement error in the y-direction due to optical magnification error of the scanner;

FRotX=Pattern placement error in the x-direction due to unintended rotation of the scanner field; and FRotY=Pattern placement error in the y-direction due to an unintended rotation of the scanner field.

These scanner correctibles are commonly estimated from measured overlay errors by a fitting procedure, such as linear regression, by fitting the measured overlay errors to the overlay errors according to the scanner model. The correctibles are then fed back to the scanner for use in correcting for the linear and rotational positioning errors of the wafer within the scanner for subsequent exposures, as well as correcting errors in projecting the scanner reticle onto field 103.

Scanner models comprising higher-order terms in wafer and/or field coordinates may be used in alternative embodiments.

2. Linearity Error in Overlay Error Measurement

As explained above, the measured displacement Meas_Displ has a linear relationship to the actual displacement Actual_Displ, but the coefficient of linearity may deviate from an ideal value of one. This relationship may be written as an equation Meas_Displ=α*Actual_Displ+β, with a non-unity coefficient of linearity α. The offset β is assumed to be negligible, and will be omitted from the computations that follow.

Linearity error in the overlay error metrology, if not characterized and corrected for, may lead to incorrect scanner correctibles and consequently to inadequate scanner correction or possibly even to an increase in pattern placement errors due to the scanner. Furthermore, it may lead to incorrect dispositioning of patterned substrates 12.

3. Use of Offset Overlay Targets for Elimination of Linearity Error

Figure 4:
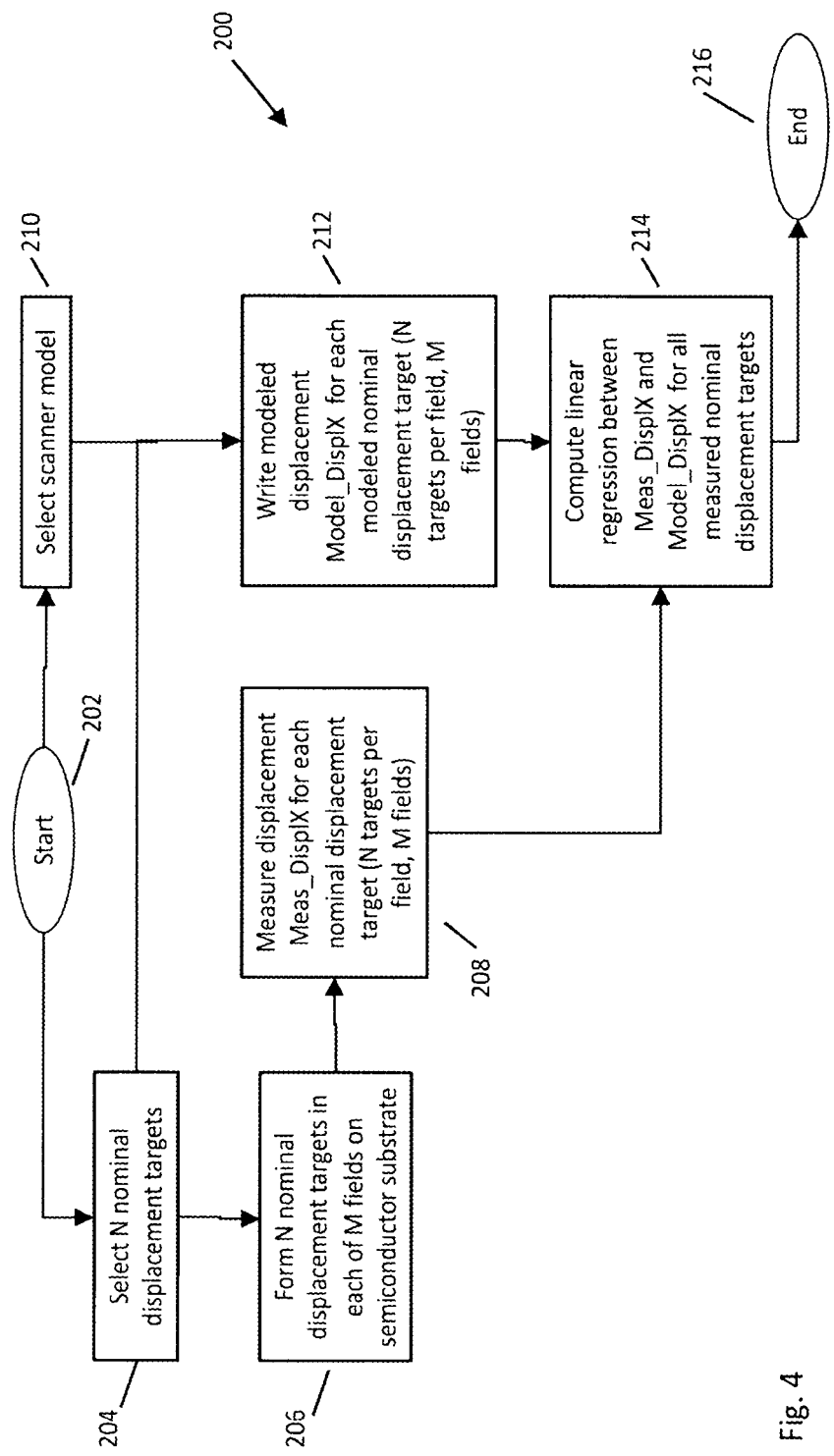
FIG. 4 is a flow chart that schematically illustrates a method for estimating the correctible of a scanner model and a coefficient of linearity of overlay error measurement, in accordance with an embodiment of the invention.

FIG. 4 is a flow chart 200 that schematically illustrates a method for estimating the correctibles of a scanner model and a coefficient of linearity of overlay error measurement, in accordance with an embodiment of the invention. The method is presented hereinbelow as it relates to displacements in the x-direction. The same method can be applied to displacements in the y-direction.

The method starts in a start step 202. In a displacement selection step 204, N nominal displacements $\Delta X_i(x^F_i, y^F_i)$ are selected. (Specific methods for displacement selection are detailed in FIGS. 5 and 6.) In a target forming step 206, offset overlay targets 112 are formed within each field 103 of semiconductor substrate 12 (FIG. 3A). In a displacement measurement step 208, the displacement between the respective centers of symmetry of the target features in layers 38 and 40 is measured for each target 112 for each field 103 using optical metrology apparatus 10. The measured M×N displacements in the x-direction are denoted by $\text{Meas\_DisplX}(x^W_{i,j}, y^W_{i,j}, x^F_i, y^F_i)$, wherein i=1, 2, . . . , N and j=1, 2, . . . , M.

In a scanner model selection step 210, the scanner model used for the computation is selected, for example the model described hereinabove. In a modeled displacement error step 212, the modeled overlay error in the original scanner model is modified to account for the different nominal displacements of targets 112. The modeled displacement is thus a sum of the overlay errors due to the scanner and the nominal displacements of targets 112, and it also takes into account the coefficient of linearity $\alpha_x$. Using the notation introduced hereinabove, the modeled displacement for the $i^{th}$ offset target 112 in the $j^{th}$ field 103 is written as:

$\text{Model\_DisplX}(x^W_{i,j}, y^W_{i,j}, x^F_i, y^F_i) = \alpha_x * [\text{OffX} + \text{ScalX}*x^W_{i,j} + \text{WRotX}*y^W_{i,j} + \text{MagX}*x^F_i + \text{FRotX}*y^F_i + \Delta X_i(x^F_i, y^F_i)]$ As the locations of offset targets 112 are defined by the reticles used in the scanner in the photolithographic process, $\Delta X_i$ depends only on the field coordinates $(x^F_i, y^F_i)$.

In a computation step 214, scanner correctibles OffX, ScalX, WRotX, MagX, FRotX and the coefficient of linearity $\alpha_x$ are estimated by applying a method of regression between all M×N values of the modeled displacement $\text{Model\_DisplX}(x^W_{i,j}, y^W_{i,j}, x^F_i, y^F_i)$ and the respective measured values of displacement $\text{Meas\_DisplX}(x^W_{i,j}, y^W_{i,j}, x^F_i, y^F_i)$. As the model comprises products of variables, a higher-order regression, rather than linear regression, needs to be applied. The objective of the method of regression is to minimize the impact of possible random or higher-order metrology errors on the estimated scanner correctibles and on the coefficient of linearity. Performing the regression finds the set of values of the correctible and the coefficient of linearity that minimize the sum $S_x$ given by:

$$S_x = \sum_{j=1}^{M} \sum_{i=1}^{N} [\text{Meas\_DisplX}(x^W_{i,j}, y^W_{i,j}, x^F_i, y^F_i) - \text{Model\_DisplX}(x^W_{i,j}, y^W_{i,j}, x^F_i, y^F_i)]^2$$

Alternatively, instead of including all fields 103 in estimating a single coefficient of linearity $\alpha_x$, the computation of $\alpha_x$ may be performed based on one or more subsets of fields 103, with each subset comprising one or more fields (not shown in flow chart 200). Further alternatively, the displacements may be averaged over all the fields, and the terms relating to the wafer model may be omitted. By estimating $\alpha_x$ for multiple subsets of fields 103 across semiconductor substrate 12, multiple respective values of $\alpha_x$ are obtained across the substrate, reflecting potential measurement deviations across the substrate and concomitant variations of the coefficient of linearity $\alpha_x$ of the overlay error metrology. For estimating $\alpha_x$ over subsets of fields 103, the sum $S_x$ hereinabove is computed for each subset separately, with the limits of the sums in $S_x$ modified accordingly. The method ends in an end step 216.

As an alternative to non-linear regression, other computational methods that are known in the art for fitting measurements to a model may be used. These methods may include, for example, a non-linear change of variables, which may allow application of linear regression.

4. Choice of Offset Overlay Targets

Figure 5:
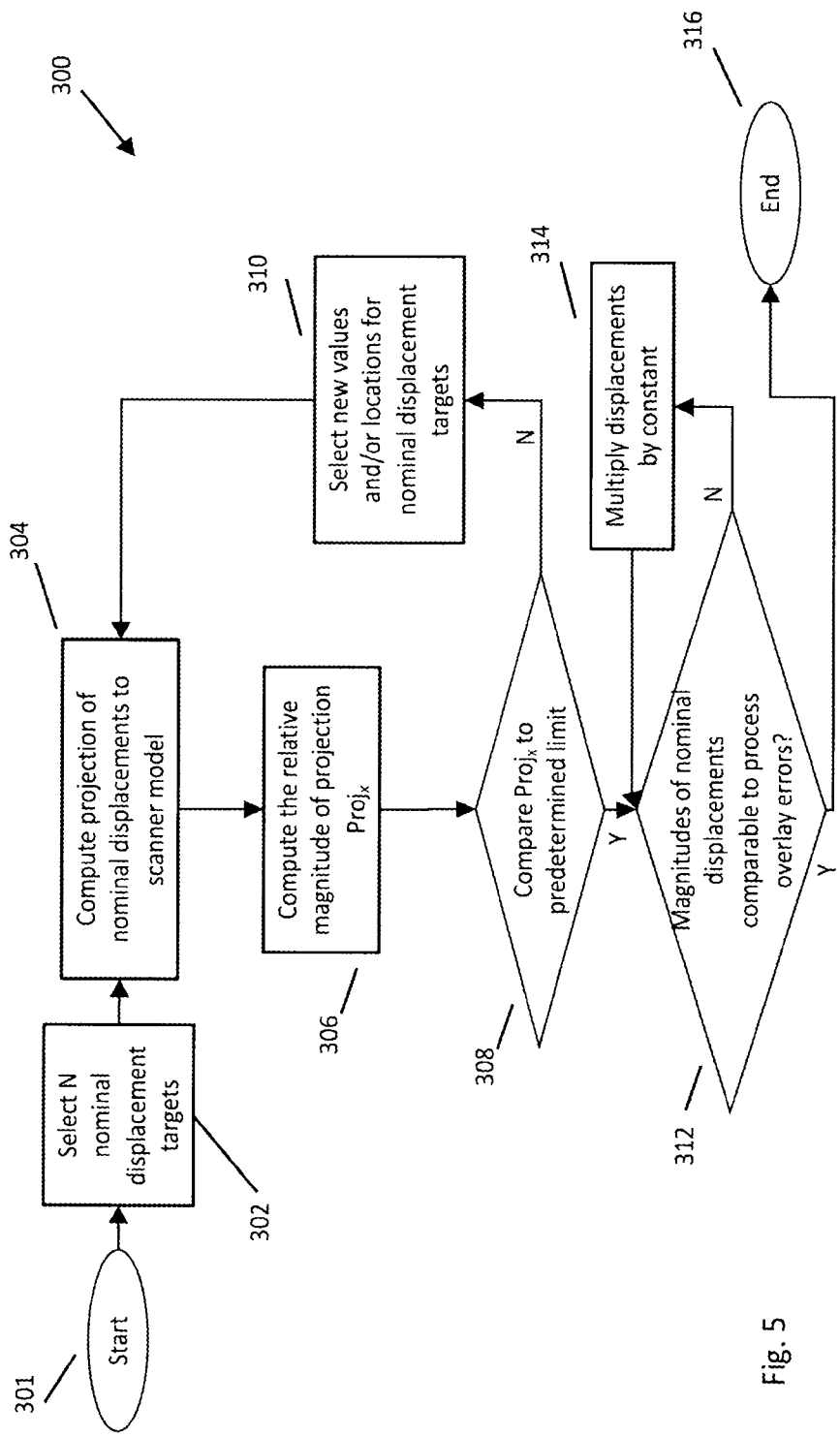
FIGS. 5 and 6 are flow charts that schematically illustrate alternative methods for selecting overlay targets, in accordance with an embodiment of the invention.
Figure 6:
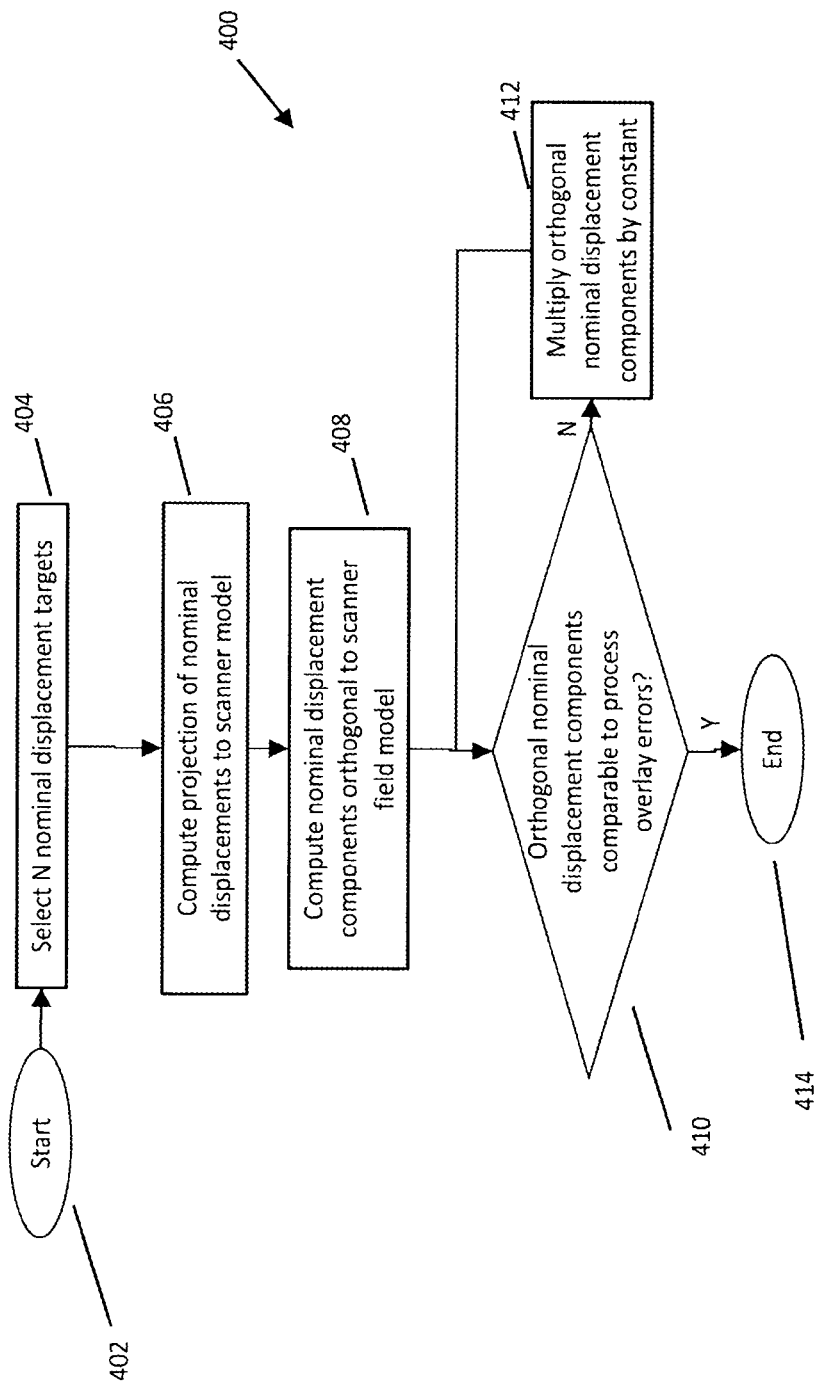

FIGS. 5 and 6 are flow charts 300 and 400, respectively, that schematically illustrate two alternative methods for selecting offset overlay targets 112, in accordance with an embodiment of the invention.

If the magnitudes of the N offset overlay targets 112 and their locations were to lie in the linear space of the scanner model, i.e., if the combination of the nominal displacements and target locations of the N targets could be completely described by the scanner model, the offset overlay targets would only modify the estimates of the scanner correctibles but would not yield any information about the coefficients of linearity $\alpha_x$ and $\alpha_y$ through the method described in FIG. 4. Thus, the scanner correctibles would include both errors due to the nominal displacements and due to the uncorrected values of the coefficients of linearity $\alpha_x$ and $\alpha_x$. Therefore, the magnitudes of the displacement of the centers of symmetry in targets 112 and the locations of the targets should be chosen in displacement selection step 204 of FIG. 4 (and implemented in target forming step 206) so that they are at least partially orthogonal to the scanner model used in the computation. The term "partially orthogonal" is used here to mean that the vector of the displacements has a component orthogonal to the scanner model. Since the locations of targets 112 depend on the field coordinates $(x^F, y^F)$, only the field-coordinate dependent part of the scanner model is used for determining the orthogonality.

The above-described requirement may be fulfilled (for a linear scanner model) for almost any randomly chosen set of displacements $\Delta X_i(x^F_i, y^F_i)$ (i=1, 2, ... N) as long as N is sufficiently large to give measurements that are statistically significant. However, for numerical considerations, systematic methods, such as shown in FIGS. 5 and 6 hereinbelow, are advantageous.

Flow chart 300 (FIG. 5) shows an iterative method for determination and improvement of the orthogonality of offset overlay targets 112 to the scanner model. The method starts at a start step 301. In a selection step 302, N nominal displacements $\Delta X_i(x^F_i, y^F_i)$ are selected. In a projection step 304, the projection $MagX^* x^F_i + FRotX^* y^F_i$ of $\Delta X_i(x^F_i, y^F_i)$ onto the scanner field model is computed by estimating the scanner field correctibles MagX and FRotX from a linear regression between $\Delta X_i(x^F_i, y^F_i)$ and $MagX^* x^F_i + FRotX^* y^F_i$, for i=1, 2, ..., N. In a projection magnitude step 306, the relative magnitude of the projection, $Proj_x$, is computed as $$Proj_x = \sqrt{MagX^2 + FRotX^2} / \sqrt{\sum_{i=1}^{N}(\Delta X_i)^2}.$$

In a first comparison step 308, $Proj_x$ is compared to a predetermined limit. If $Proj_x$ exceeds the predetermined limit, another selection of nominal displacements $\Delta X_i(x^F_i, y^F_i)$ is made in an adjustment step 310 by either randomly choosing magnitudes and/or locations for the nominal displacement targets or by systematically iterating over the vectors from a linear basis of the larger linear space (including as a subspace the linear space spanned by the vectors of the model). The loop of projection step 304, projection magnitude step 306, first comparison step 308, and adjustment step 310 is iterated, until $Proj_x$ reaches a value below the predetermined limit.

Once nominal displacements $\Delta X_i(x^F_i, y^F_i)$ have been determined so that $Proj_x$ does not exceed the predetermined limit, the magnitudes of the nominal displacements $\Delta X_i(x^F_i, y^F_i)$ are compared in a second comparison step 312 to the expected magnitudes of overlay errors in the photolithographic process. If the magnitudes of the nominal displacements differ significantly from the expected range of overlay error values for the photolithographic process under consideration, all components of $\Delta X_i(x^F_i, y^F_i)$ are multiplied in a scaling step 314 by a common constant, in order to bring the magnitudes of the nominal displacement into the expected range. The loop of steps 312 and 314 is iterated until the magnitudes of the nominal displacements are satisfactory, and the process ends at an end step 316. The nominal displacements $\Delta X_i(x^F_i, y^F_i)$ resulting from the method are applied in forming targets 112 a photolithographic step, such as step 206 (FIG. 4).

Flow chart 400 (FIG. 6) shows a direct method for choosing offset overlay targets 112 that are orthogonal to the scanner field model, that have a zero projection onto the scanner field model. The method starts with a start step 402. Similarly to steps 302 and 304 (FIG. 5), in a selection step 404, N nominal displacements $\Delta X_i(x^F_i, y^F_i)$ are selected. In a projection step 406, the projection $MagX^* x^F_i + FRotX^* y^F_i$ of $\Delta X_i(x^F_i, y^F_i)$ onto the scanner field model is computed by estimating the scanner field correctibles MagX and FRotX from a linear regression between $\Delta X_i(x^F_i, y^F_i)$ and $MagX^* x^F_i + FRotX^* y^F_i$, for i=1, 2, ..., N. In an orthogonal nominal displacement component computation step 408, the component $\Delta X_i^{ORTHO}(x^F_i, y^F_i)$ of $\Delta X_i(x^F_i, y^F_i)$, i.e., the component of $\Delta X_i(x^F_i, y^F_i)$ that is orthogonal to the scanner field model $MagX^* x^F_i + FRotX^* y^F_i$, is computed as $\Delta X_i^{ORTHO}(x^F_i, y^F_i) = \Delta X_i(x^F_i, y^F_i) - MagX^* x^F_i + FRotX^* y^F_i$, for i=1, 2, ..., N.

Similarly to steps 312 and 314 (FIG. 5), in a comparison step 410, the magnitudes of the orthogonal nominal displacement components $\Delta X_i^{ORTHO}(x^F_i, y^F_i)$ are compared to the expected magnitudes of overlay errors in the photolithographic process under consideration. If necessary, the orthogonal nominal displacement components are multiplied by a common constant in a scaling step 412 until the required magnitudes of the nominal displacement components of $\Delta X_i^{ORTHO}(x^F_i, y^F_i)$ are achieved. The method ends in an end step 414. The orthogonal nominal displacements $\Delta X_i^{ORTHO}(x^F_i, y^F_i)$, resulting from the method, are applied in forming targets 112 in a lithographic step, such as step 206 (FIG. 4).

Similarly, for a higher-dimensional scanner model, i.e. for a non-linear model, the chosen set of displacements $\Delta X_i(x^F_i, y^F_i)$ should not lie in the higher-dimensional plane defined by the scanner model. For example, for a quadratic scanner model the higher-dimensional plane is spanned by five vectors $(x_1^F, \ldots, x_N^F)$, $(y_1^F, \ldots, y_N^F)$, $((x_1^F)^2, \ldots, (x_N^F)^2)$, $((y_1^F)^2, \ldots, (y_N^F)^2)$, and $(x_1^F y_1^F, \ldots, x_N^F y_N^F)$. In this case, for N>5, almost any vector $\Delta X_i(x^F_i, y^F_i)$ will fulfill the requirement of sufficient orthogonality.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for semiconductor metrology, comprising:
    depositing a first film layer on a semiconductor substrate and a second film layer overlying the first film layer;
    patterning the first and second film layers to define a plurality of overlay targets comprising:
        first target features formed in the first film layer having respective first locations, which are spaced apart by first nominal distances; and
        second target features formed in the second film layer having respective second locations, which are spaced apart by second nominal distances, which are different from the first nominal distances, each second target feature overlying a respective first target feature to define a respective one of the overlay targets;
capturing at least one image, using an imaging assembly, of the semiconductor substrate on which the overlay targets have been formed;
processing the at least one image to measure displacements between the respective first and second locations in each of the overlay targets; and
based on the measured displacements and the first and second nominal distances, estimating both an actual overlay error between the patterning of the first and second film layers and a measurement error of the imaging assembly.

2. The method according to claim 1, wherein patterning the first and second film layers comprises patterning a matrix of fields and defining multiple of the overlay targets in each of the fields, and capturing an image comprises capturing the at least one image of the multiple overlay targets in at least one of the fields.

3. The method according to claim 1, wherein the first nominal distances and the second nominal distances are selected so that for each of the overlay targets the respective displacement between the first and second locations corresponds to a respective nominal displacement.

4. The method according to claim 3, wherein estimating both the actual overlay error and the measurement error comprises comparing the measured displacements to respective modeled displacements for a set of the overlay targets, each of the modeled displacements comprising a sum of a displacement computed from a scanner model and the respective nominal displacement for a given overlay target.

5. The method according to claim 4, wherein the scanner model comprises coefficients defining displacements between patterns formed in the first and second film layers by a photolithographic process.

6. The method according to claim 5, wherein estimating the measurement error comprises finding a coefficient of linearity between the respective nominal displacements and the measured displacements over the set of the overlay targets.

7. The method according to claim 6, wherein finding the coefficient of linearity comprises applying a method of regression between the respective measured and modeled displacements in order to estimate the coefficients of the scanner model and the coefficient of linearity.

8. The method according to claim 6, wherein estimating the actual overlay error comprises applying the coefficient of linearity to the measured displacements.

9. The method according to claim 3, wherein estimating the actual overlay error and the measurement error comprises finding coefficients of a scanner model, and wherein patterning the first and second film layers comprises selecting respective nominal displacements of the overlay targets that are at least partially orthogonal to the scanner model.

10. The method according to claim 9, wherein selecting the respective nominal displacements comprises computing a projection of the nominal displacements onto the scanner model, and choosing the respective nominal displacements so that the projection does not exceed a predefined limit.

11. The method according to claim 9, wherein selecting the respective nominal displacements comprises computing at a location of each of the overlay targets an orthogonal nominal displacement for use in choosing the respective nominal displacements of the overlay targets.

12. An optical metrology apparatus comprising:
a semiconductor substrate having deposited thereon a first film layer and a second film layer overlying the first film layer, wherein the first and second film layers are patterned to define a plurality of overlay targets comprising:
first target features formed in the first film layer having respective first locations, which are spaced apart by first nominal distances; and
second target features formed in the second film layer having respective second locations, which are spaced apart by second nominal distances, which are different from the first nominal distances, each second target feature overlying a respective first target feature to define a respective one of the overlay targets;
an imaging assembly configured to capture at least one image of the semiconductor substrate on which the overlay targets have been formed; and
a controller, configured to process the at least one image to measure displacements between the respective first and second locations in each of the overlay targets and based on the measured displacements and the first and second nominal distances, to estimate both an actual overlay error between the patterning of the first and second film layers and a measurement error of the imaging assembly.

13. The apparatus according to claim 12, wherein the first and second film layers are patterned to form a matrix of fields and to define multiple of the overlay targets in each of the fields, and the imaging assembly is configured to capture at least one image of the multiple overlay targets in at least one of the fields.

14. The apparatus according to claim 12, wherein the first nominal distances and the second nominal distances are selected so that for each of the overlay targets the respective displacement between the first and second locations corresponds to a respective nominal displacement.

15. The apparatus according to claim 14, wherein the controller is configured to compare the measured displacements to respective modeled displacements for a set of the overlay targets, each of the modeled displacements comprising a sum of a displacement computed from a scanner model and the respective nominal displacement for a given overlay target.

16. The apparatus according to claim 15, wherein the scanner model comprises coefficients defining displacements between patterns formed in the first and second film layers by a photolithographic process.

17. The apparatus according to claim 16, wherein estimating the measurement error comprises finding a coefficient of linearity between the respective nominal displacements and the measured displacements over the set of the overlay targets.

18. The apparatus according to claim 17, wherein finding the coefficient of linearity comprises applying a method of regression between the respective measured and modeled displacements in order to estimate the coefficients of the scanner model and the coefficient of linearity.

19. The apparatus according to claim 17, wherein estimating the actual overlay error comprises applying the coefficient of linearity to the measured displacements.

20. The apparatus according to claim 14, wherein estimating the actual overlay error and the measurement error comprises finding coefficients of a scanner model, and wherein the respective nominal displacements of the overlay targets are at least partially orthogonal to the scanner model.

* * * * *